US011432405B2

(12) United States Patent
Jain et al.

(10) Patent No.: US 11,432,405 B2
(45) Date of Patent: Aug. 30, 2022

(54) METHODS FOR ATTACHING LARGE COMPONENTS IN A PACKAGE SUBSTRATE FOR ADVANCED POWER DELIVERY

(71) Applicant: Intel Corporation, Santa Clara, CA (US)

(72) Inventors: Rahul Jain, Gilbert, AZ (US); Prithwish Chatterjee, Tempe, AZ (US); Kyu-oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 904 days.

(21) Appl. No.: 16/024,713

(22) Filed: Jun. 29, 2018

(65) Prior Publication Data

US 2020/0008302 A1   Jan. 2, 2020

(51) Int. Cl.
| | |
|---|---|
| *H05K 1/18* | (2006.01) |
| *H01L 25/16* | (2006.01) |
| *H01L 49/02* | (2006.01) |
| *H01L 23/498* | (2006.01) |
| *H01L 21/48* | (2006.01) |
| *H05K 1/11* | (2006.01) |
| *H05K 3/34* | (2006.01) |
| *H05K 3/46* | (2006.01) |
| *H01L 23/13* | (2006.01) |

(52) U.S. Cl.
CPC ......... *H05K 1/183* (2013.01); *H01L 21/4853* (2013.01); *H01L 21/4857* (2013.01); *H01L 23/13* (2013.01); *H01L 23/49811* (2013.01); *H01L 23/49822* (2013.01); *H01L 23/49827* (2013.01); *H01L 23/49838* (2013.01); *H01L 25/16* (2013.01); *H01L 28/10* (2013.01); *H01L 28/40* (2013.01); *H05K 1/115* (2013.01); *H05K 3/34* (2013.01); *H05K 3/4644* (2013.01); *H05K 2201/1003* (2013.01); *H05K 2201/10015* (2013.01)

(58) Field of Classification Search
CPC .......... H05K 1/115; H05K 1/183; H05K 3/34; H05K 3/4644; H05K 2201/10015; H05K 2201/1003; H01L 21/4853; H01L 21/4857; H01L 23/13; H01L 23/50; H01L 23/49811; H01L 23/49822; H01L 23/49838; H01L 23/49827; H01L 25/16; H01L 28/10; H01L 28/40
USPC ....................................................... 174/260
See application file for complete search history.

(56) References Cited

U.S. PATENT DOCUMENTS

2009/0107708 A1* 4/2009 Takahashi ............... H05K 1/183
                                                           174/257
2017/0372980 A1* 12/2017 Kurahashi ............... H01L 23/13

FOREIGN PATENT DOCUMENTS

JP              3792445 B2 *   7/2006    ............. H01L 23/13

* cited by examiner

*Primary Examiner* — Kevin J Comber
(74) *Attorney, Agent, or Firm* — Schwabe, Williamson & Wyatt P.C.

(57) ABSTRACT

A package substrate is disclosed. The package substrate includes a substrate core, a cavity below the substrate core that extends from a surface of a first resist layer to a bottom surface of the package substrate, and a first terminal and a second terminal in the first resist layer. The package substrate also includes one or more passive components that are coupled inside the cavity to the first terminal and the second terminal.

17 Claims, 7 Drawing Sheets

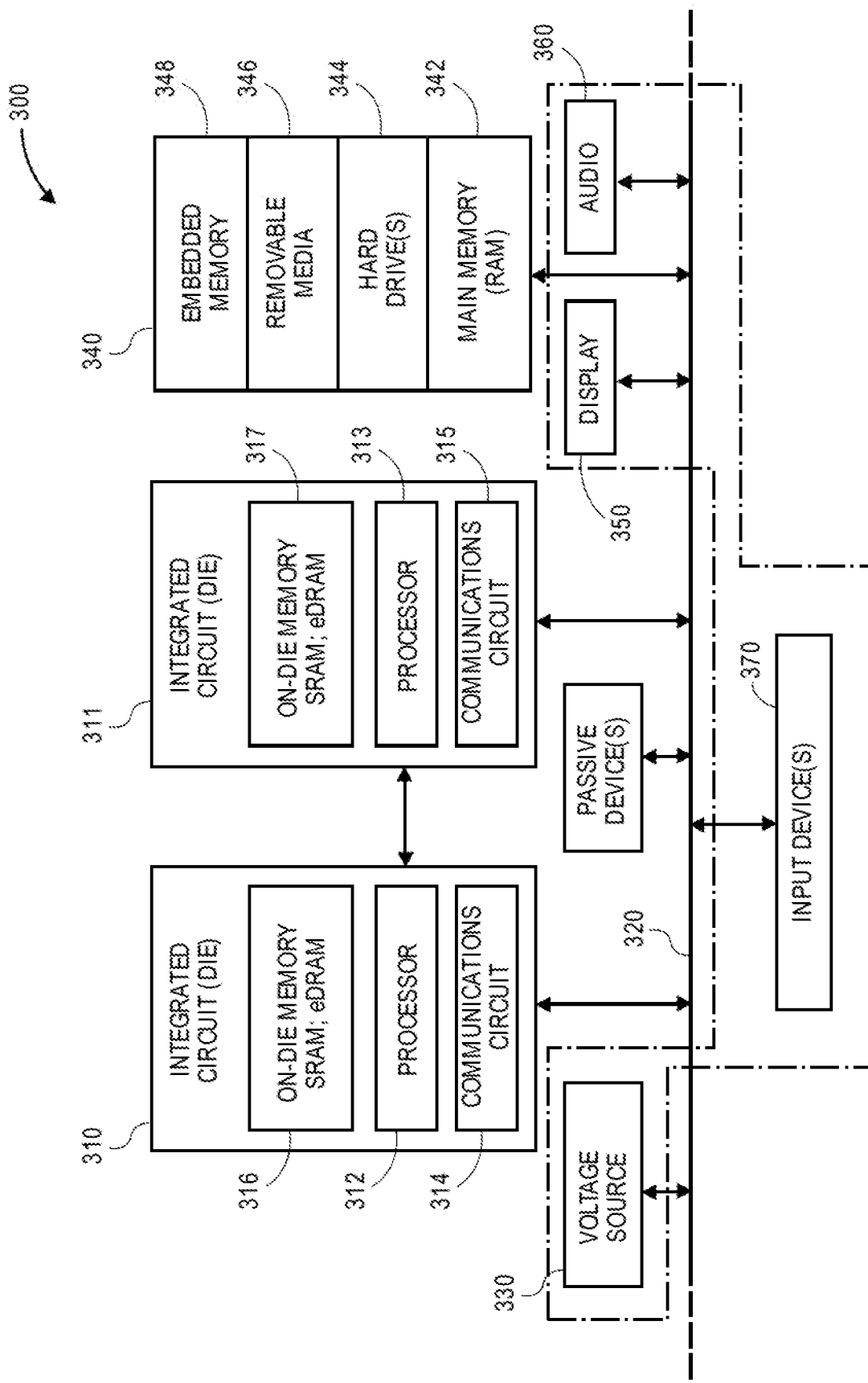

METHODS FOR ATTACHING LARGE COMPONENTS IN A PACKAGE SUBSTRATE FOR ADVANCED POWER DELIVERY

TECHNICAL FIELD

Embodiments of the disclosure pertain to methods for attaching components to a package substrate and, in particular, methods for attaching large components in a package substrate for advanced power delivery.

BACKGROUND

With the growing focus on advanced and higher performance computing applications, e.g., virtual and augmented reality, the demand for better and more efficient power delivery approaches in semiconductor packaging has significantly increased. Traditional power-delivery approaches that use stand-alone capacitors and inductors, either arranged on substrates or on printed circuit boards (PCBs) do not always adequately meet the requirements. A possible approach is to implement large components with higher efficiency. However, the use of large components in substrate manufacturing presents Z-height and surface mount technology challenges.

For example, some previous approaches involve alternately attaching large components on the PCB as a way to incorporate such into semiconductor packaging designs. However, this approach can increase the form factor of the PCB board significantly and can also cause inefficient power delivery. In some previous approaches components are attached to the package by standard paste print. However, attaching components to the package by standard paste print causes surface mount technology (SMT) challenges. In addition, the attachment of components on the back side of a package substrate requires the formation of a recess in the PCB.

BRIEF DESCRIPTION OF THE DRAWINGS

FIG. 3 is a schematic of a computer system according to an embodiment of the present invention.

DESCRIPTION OF THE EMBODIMENTS

Figure 1:
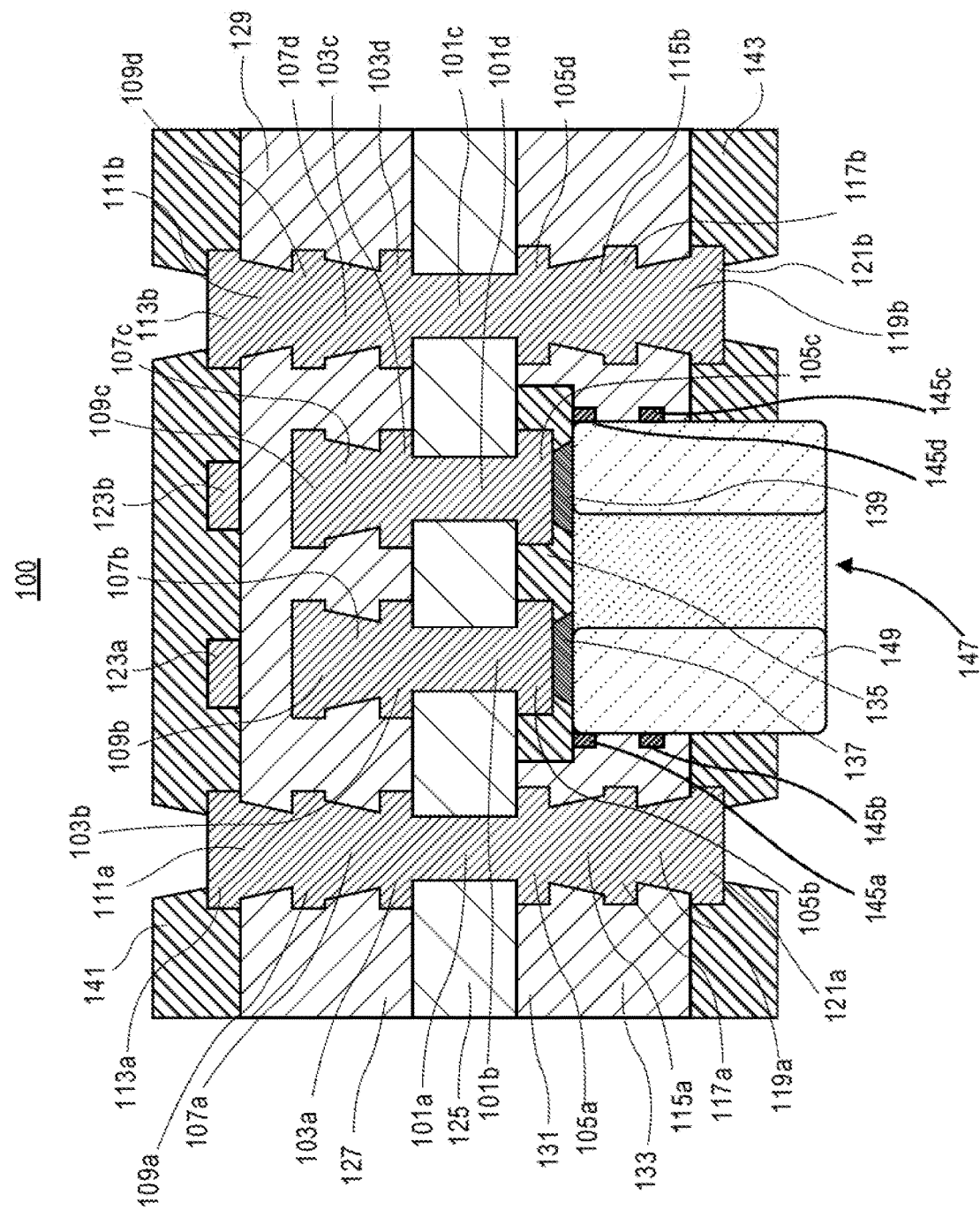
FIG. 1 is an illustration of a package substrate that includes a cavity for accommodating components for efficient power delivery according to an embodiment.

Methods for attaching large components to a package substrate for advanced power delivery, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Shortcomings of previous approaches to attaching large components to a package substrate or a printed circuit board (PCB) for power delivery purposes include increases to PCB form factor, inefficient power delivery, SMT challenges, the necessity of forming a recess in the PCB, the failure to address component spacing issues and prohibitive cost. Methods for attaching large components in a package substrate for efficient power delivery that addresses the shortcomings of the previous approaches is disclosed. In an embodiment, a unique cavity that is formed in the first dielectric layer of a package substrate is used to accommodate components that support efficient power delivery. The cavity is partially bounded by solder resist which is configured to confine conductive material that functions as terminals for the components placed into the cavity to support efficient power delivery. In an embodiment, large sized components such as inductors and/or capacitors can be coupled to the package substrate by placement into the cavity. This eliminates the need to place these components on the surface of a package substrate or a PCB. Moreover, it eliminates the associated SMT challenges that are involved with mounting such components. In addition, the aforementioned use of solder resist enables tighter printing of paste for closer placement of adjoining capacitors and eliminates undesirable solder paste spreading issues. The disclosed process also eliminates the additional work that is needed to form a recess in the motherboard (RiMB) for the purpose of preventing an increase in Z height of the package that is due to the surface mounting of such components.

FIG. 1 is an illustration of a package substrate 100 that includes a cavity for accommodating components for efficient power delivery according to an embodiment. FIG. 1 shows through structures 101a-101d, pads 103a-103d, pads 105a-105d, via structures 107a-107d, via pads 109a-109d, via structure 111a and 111b, via pads 113a and 113b, via structures 115a and 115b, via pads 117a and 117b, via structures 119a and 119b, via pads 121a and 121b, conductive structures 123a and 123b, substrate core 125, buildup layer 127, buildup layer 129, buildup layer 131, buildup layer 133, resist layer 135, conductive terminal 137, conductive terminal 139, resist layer 141, resist layer 143, release film components 145a-145d, cavity 147 and passive component 149.

Referring to FIG. 1 the through structures 101a-101d extend through the substrate core 125. The pads 103a-103d are formed above the through structures 101a-101d. The pads 105a-105d are formed below the through structures 101a-101d. The via structures 107a-107d are formed above the pads 103a-103d. The via structure 111a and the via structure 111b are formed above the pad 109a and the pad 109d and below the via pad 113a and the via pad 113d. The via structure 115a and the via structure 115b are formed below the via pad 105a and the via pad 105d and above the via pad 117a and the via pad 117b. The via structure 119a and the via structure 119b are formed above the via pad 121a and the via pad 121b and below the via pad 117a and the via pad 117b. The resist layer 135 is formed underneath the substrate core 125. The conductive terminal 137 and the conductive terminal 139 are formed in openings in the resist layer 135. The conductive structures 123a and 123b are formed between the pads 113a and 113b and above the buildup layer 129. The buildup layer 127 is formed above the substrate core 125. The buildup layer 131 is formed below the substrate core 125. The buildup layer 133 is formed below the buildup layer 131. The resist layer 135 is formed below the substrate core 125, above the buildup layer 133 and between parts of the buildup layer 131 that are located on the right and left side of the package substrate 100. The resist layer 143 is formed beneath the buildup layer 133. The cavity 147 is formed underneath resist layer 135 and between parts of the buildup layer 133 and the resist layer 143 located on the right and left sides of the package substrate 100. The large component 149 can be placed into the cavity 147 and coupled to the conductive terminals 137 and 139.

In an embodiment, the through structures 101a-101d can be formed from copper. In other embodiments, the through structures 101a-101d can be formed from other materials. In an embodiment, the pads 103a-103d can be formed from copper. In an embodiment, the pads 103a-103d can be formed from other materials. In an embodiment, the pads 105a-105d can be formed from copper. In an embodiment, the pads 105a-105d can be formed from other materials. In an embodiment, the via structures 107a-107d can be formed from copper. In other embodiments, the via structures 107a-107d can be formed from other materials. In one embodiment, the via pads 109a-109d can be formed from copper. In other embodiments, the via pads 109a-109d can be formed from other materials. In an embodiment, the via structures 111a and 111b can be formed from copper. In other embodiments, the via structures 111a and 111b can be formed from other materials. In an embodiment, via pads 113a and 113b can be formed from copper. In other embodiments, via pads 113a and 113b can be formed from other materials. In an embodiment, the via structures 115a and 115b can be formed from copper. In other embodiments, the via structures 115a and 115b can be formed from other materials. In an embodiment, via pads 117a and 117b can be formed from copper. In other embodiments, the via pads 117a and 117b can be formed from other materials. In an embodiment, the via structures 119a and 119b can be formed from copper. In other embodiments, the via structures 119a and 119b can be formed from other materials. In an embodiment, the via pads 121a and 121b can be formed from copper. In other embodiments, the via pads 121a and 121b can be formed from other materials. In an embodiment, conductive structures 123a and 123b can be formed from copper. In other embodiments, the conductive structures 123a and 123b can be formed from other materials. In an embodiment, the substrate core 125 can be formed from organic or ceramic materials. In other embodiments, the substrate core can be formed from other materials. In an embodiment, the buildup layer 127 can be formed from silica filled epoxy. In an embodiment, the buildup layer 127 can be formed from other materials. In an embodiment, the resist layer 135, 141 and 143 can be formed from polyimide materials. In other embodiments, the resist layer 135, 141 and 143 can be formed from other materials. In an embodiment, the conductive terminals 137 and 139 can be formed from solder. In other embodiments, the conductive terminals 137 and 139 can be formed from other materials. In an embodiment, the release film components 145a-145d can be formed from acrylic resin. In other embodiments, the release film components 145a-145d can be formed from other materials.

In an embodiment, the cavity 147 is formed to accommodate the passive component 147. In an embodiment, the passive component is a capacitor. In other embodiments the passive component 147 can be an inductor or other component.

In operation, the package substrate 100, aside from serving as a base for IC packages, is also used to route signals from an integrated circuit (IC) package I/O system to the interconnection components of a PCB. In addition, in an embodiment, the cavity 147 of the package substrate 100 is used to facilitate the integration of components such as capacitors and inductors that are suitable for advanced and high performance computing applications, e.g., including but not limited to virtual reality and augmented reality, into the package substrate 100. These components can be used to support better and more efficient power delivery to an IC package by accommodating larger components without sacrificing Z height. Thus, designers are not forced to use less effective and efficient passive device options in order to avoid increases in Z height. In an embodiment, the capacity to integrate large components into the package substrate 100 allows designers to avoid placing such components on the package substrate or on a PCB. Thus, the process complexities involved in placing components on the surfaces of package substrates and PCBs is obviated. In addition, the capacity to integrate large components into the package substrate 100 enables the placement of the components in close physical proximity to the power rails of an IC package. Many applications require the placement of capacitors such as decoupling capacitors as close as possible to the power rails of an IC package. Thus, in applications where this is required, the ability to position the component within the package substrate facilitates such.

FIGS. 2A-2M are illustrations of cross-sections of a semiconductor package substrate during a fabrication process according to an embodiment.

Figure 2A:
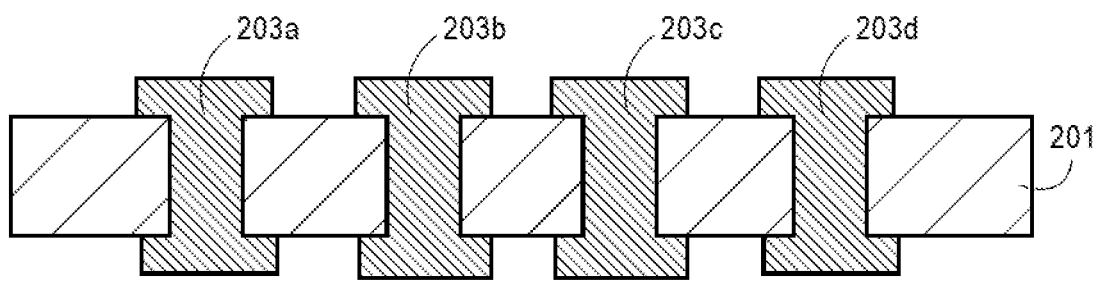
FIGS. 2A-2M are illustrations of cross-sections of a semiconductor package substrate during fabrication according to an embodiment.

Referring to FIG. 2A, operations are performed to form a substrate core 201 with preformed through structures 203a-203d.

Figure 2B:
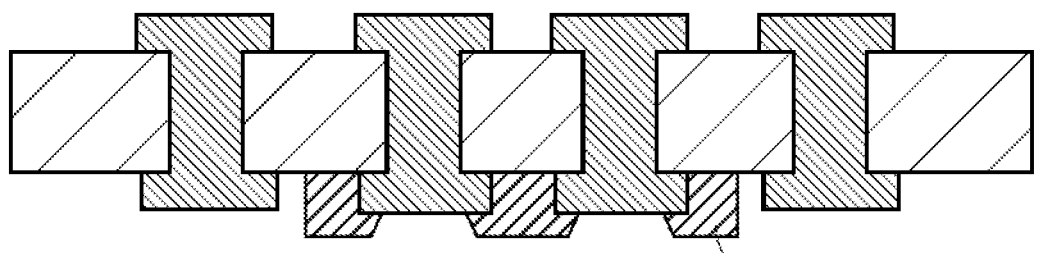

Referring to FIG. 2B, after one or more operations are performed that result in the cross-section shown in FIG. 2A, solder resist 205 is formed on the bottom of the substrate core and solder resist openings are formed.

Figure 2C:
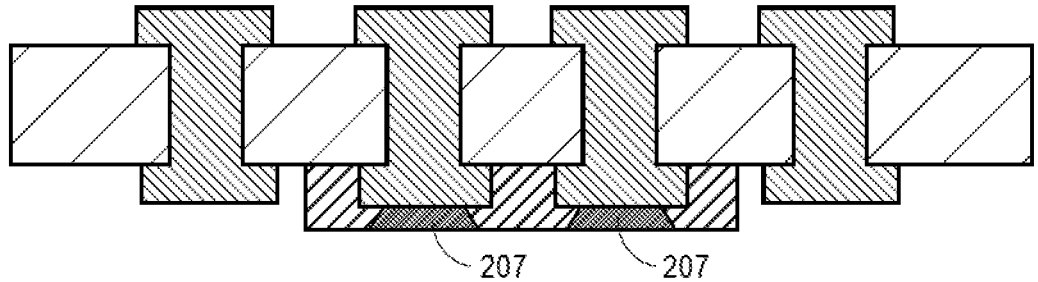

Referring to FIG. 2C, after one or more operations are performed that result in the cross-section shown in FIG. 2B, solder 207 is formed in the solder resist openings. In other embodiments, other conductive materials can be formed in the solder resist openings. In an embodiment, the conductive material can be formed by paste printing using a step stencil. In other embodiments, the conductive material can be formed using other methods.

Figure 2D:
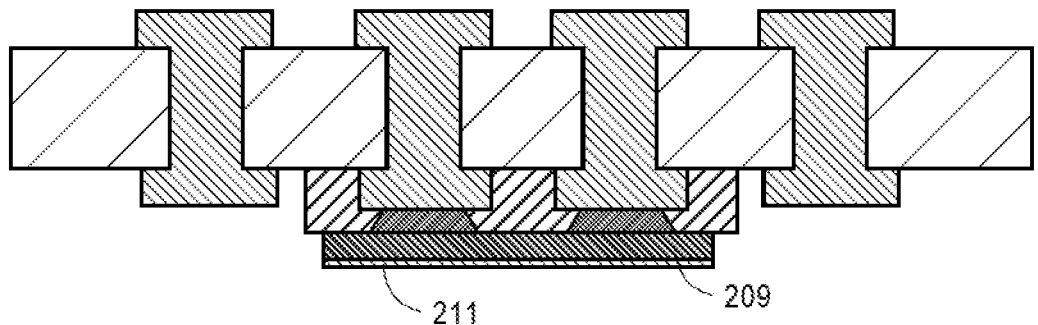

Referring to FIG. 2D, after one or more operations are performed that result in the cross-section shown in FIG. 2C, a release film 209 is formed on the surface of the resist that is located under the substrate core. The release film covers the conductive material that is formed in the solder resist openings. In addition, electroless plating 211 is formed on the surface of the release film. In other embodiments, electroless plating 211 can be formed in other suitable manners.

Figure 2E:
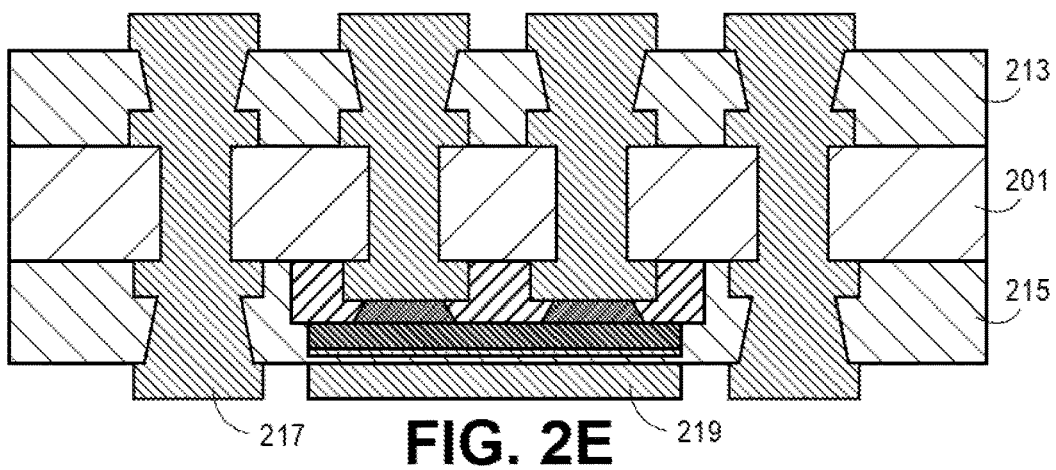

Referring to FIG. 2E, after one or more operations are performed that result in the cross-section shown in FIG. 2D, ABF lamination 213 and 215 is formed respectively on the top surface of the substrate core 201 and on the bottom surface of the substrate core 201 adjacent the sides of the resist and release film. In addition, curing, via formation and fill 217 and plating 219 is performed. In an embodiment, the via can be formed by drilling. In other embodiments, the via can be formed in other manners.

Figure 2F:
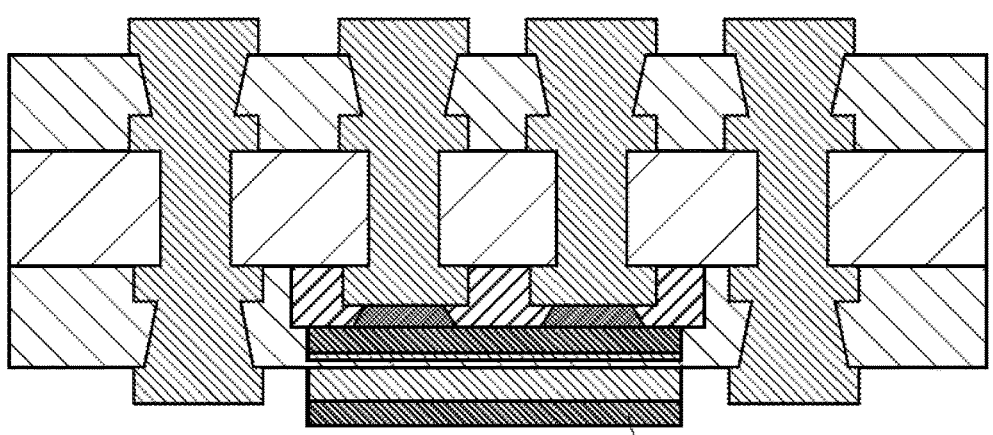

Referring to FIG. 2F, after one or more operations are performed that result in the cross-section shown in FIG. 2E, a second release film 221 is formed on the surface of the plating formed on the surface of the first release film.

Figure 2G:
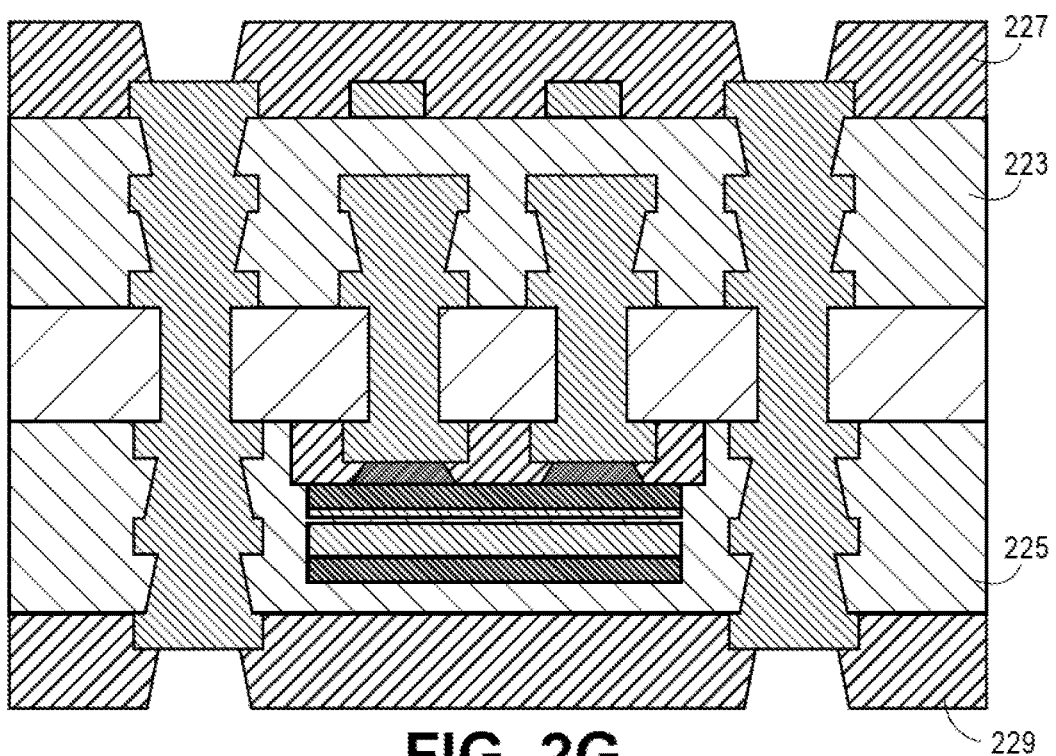

Referring to FIG. 2G, after one or more operations are performed that result in the cross-section shown in FIG. 2F, a second ABF lamination 223 and 225 is formed on the top and bottom surfaces respectively of the package substrate structure 200, vias are formed in the second ABF lamination 223 and 225, the vias are filled with conductive material, pads are formed above the filled vias, resist 227 and 229 is formed respectively on the top and the bottom surfaces of the resulting structure and openings are formed in the resist. In an embodiment, the openings are formed above the pads associated with the vias formed in the second ABF lamination 223 and 225.

Figure 2H:
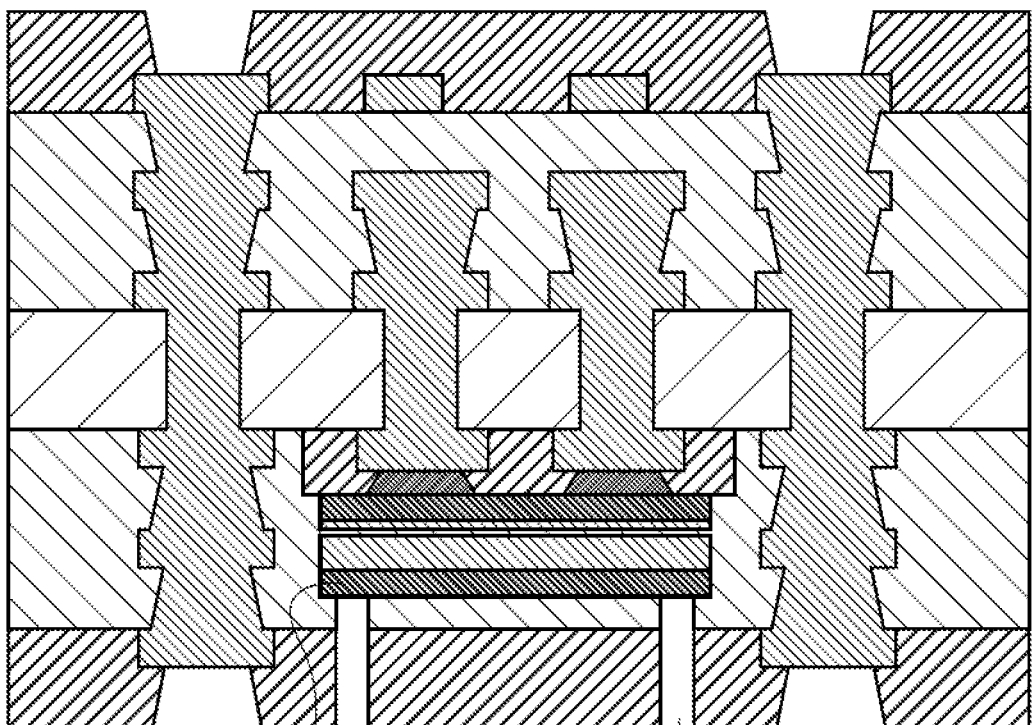

Referring to FIG. 2H, after one or more operations are performed that result in the cross-section shown in FIG. 2G, material formed below the second release 221 film (e.g., ABF lamination and resist material) is separated from surrounding material by the creation of a space 231 around the material formed below the second release film 221. In an embodiment, the material formed below the second release film 221 that is separated from the surrounding material is separated from the surrounding material by laser drilling. In other embodiments, the material that is formed below the second release film 221 that is separated from the surrounding material can be separated from the surrounding material in other suitable manners.

Figure 2I:
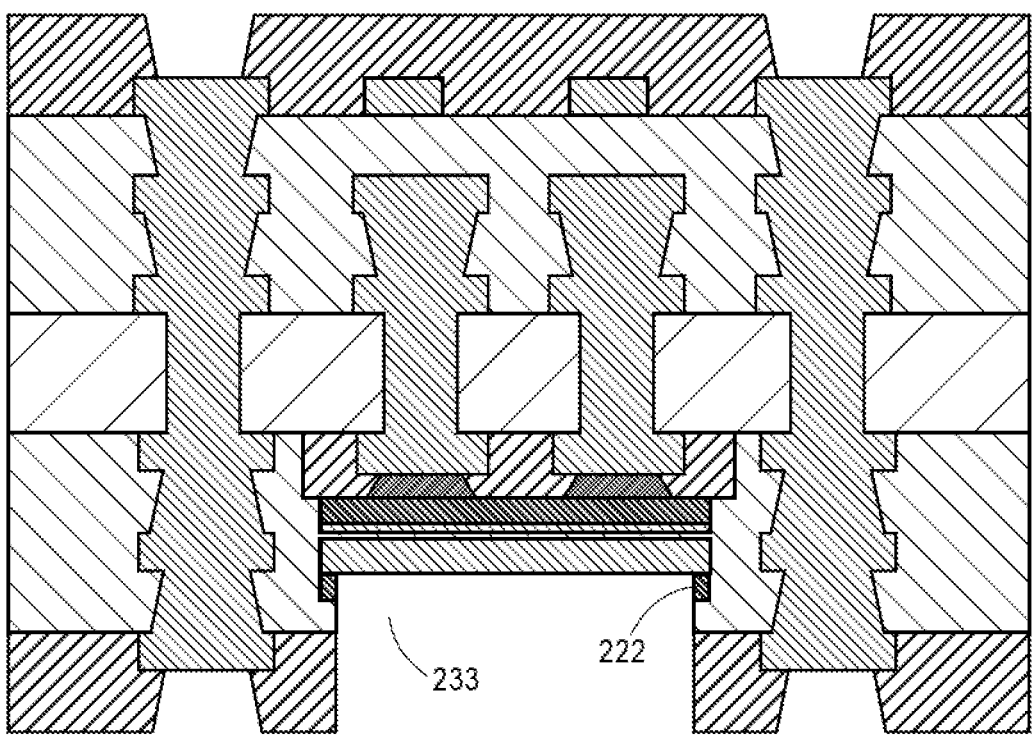

Referring to FIG. 2I, after one or more operations that result in the cross-section shown in FIG. 2H, the second release film 221 (except for small portions 222) and the material that is formed on the second release film 221 are removed from the substrate package 200 such that a cavity 233 in the substrate package 200 is formed.

Figure 2J:
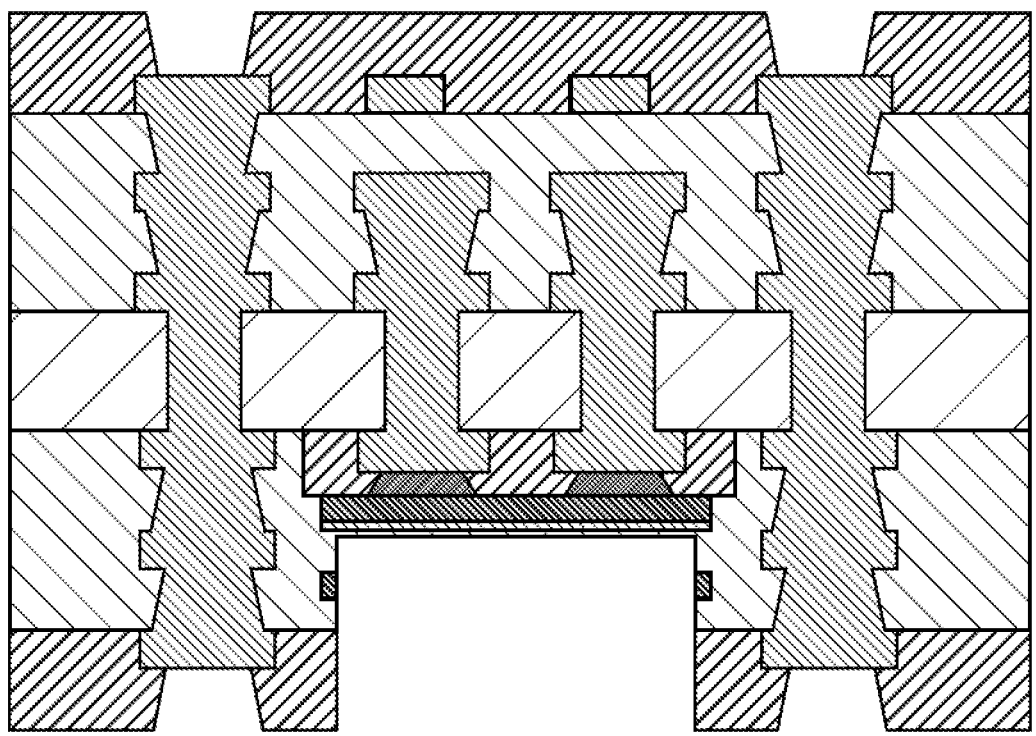
Figure 2K:
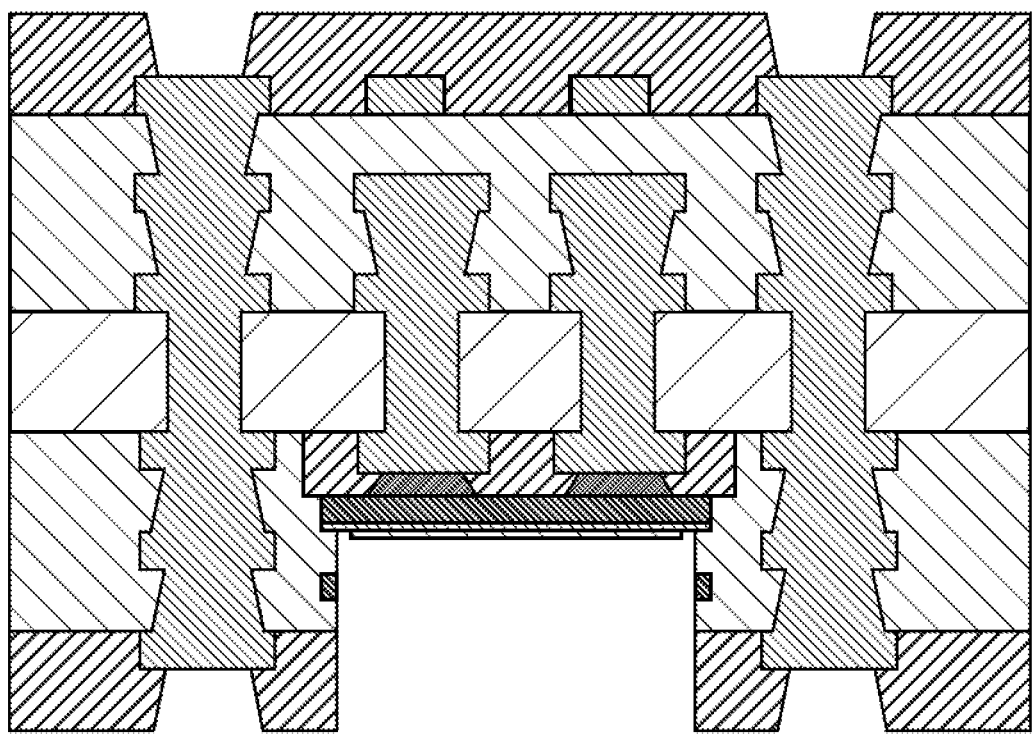
Figure 2L:
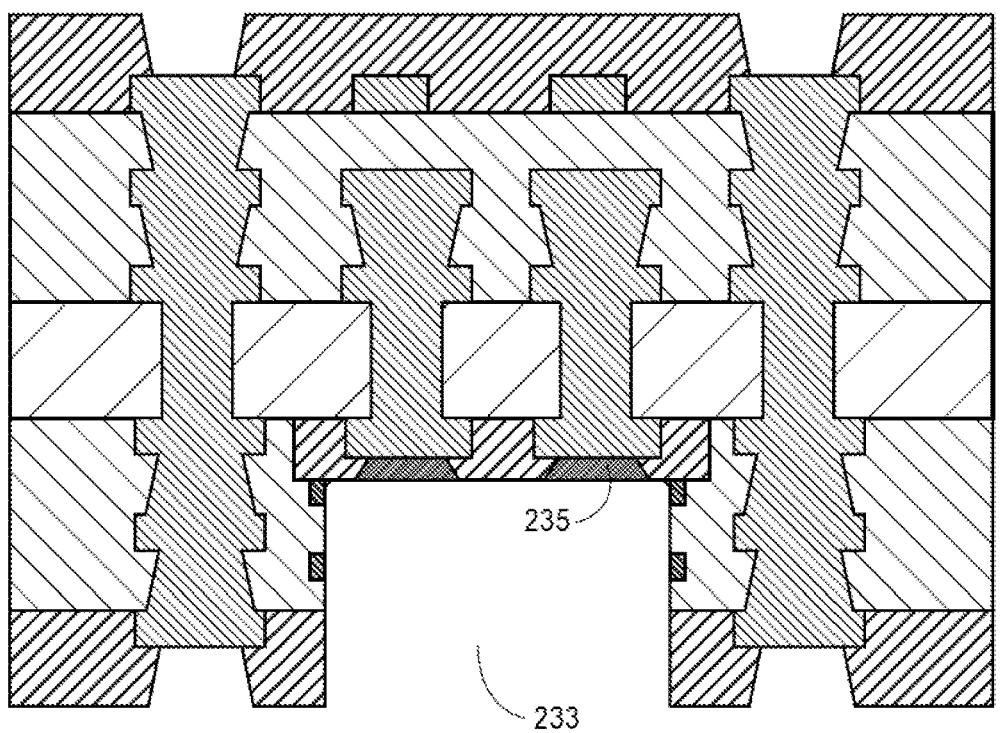
Figure 2M:
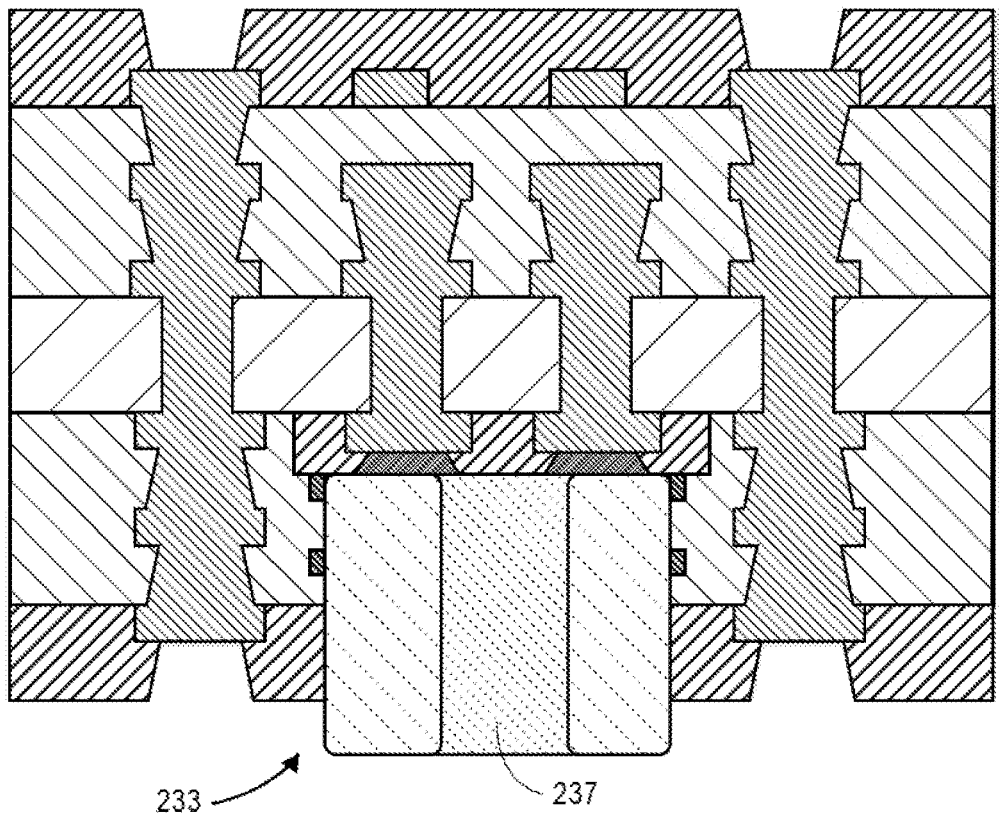

Referring to FIG. 2J, after one or more operations that result in the cross-section shown in FIG. 2I, a DFR lamination and a selective etch of copper in the cavity is performed. Referring to FIG. 2K, after one or more operations that result in the cross-section shown in FIG. 2J, the first release film is removed. The removal of the first release film exposes the conductive terminals as shown in FIG. 2L. Referring to FIG. 2L, after one or more operations that result in the cross-section shown in FIG. 2K, and the subsequent removal of the first release film, the cavity 233 is cleaned. Referring to FIG. 2M, after one or more operations that result in the cross-section shown in FIG. 2L, one or more passive components 237 are placed into the cavity 233. In an embodiment, the one or more passive components can include capacitors and/or inductors. In other embodiments, the one or more passive components can include other components.

FIG. 3 is a schematic of a computer system 300, in accordance with an embodiment of the present invention. The computer system 300 (also referred to as the electronic system 300) as depicted can embody package substrate 100, according to any of the several disclosed embodiments and their equivalents as set forth in this disclosure. The computer system 300 may be a mobile device such as a netbook computer. The computer system 300 may be a mobile device such as a wireless smart phone. The computer system 300 may be a desktop computer. The computer system 300 may be a hand-held reader. The computer system 300 may be a server system. The computer system 300 may be a supercomputer or high-performance computing system.

In an embodiment, the electronic system 300 is a computer system that includes a system bus 320 to electrically couple the various components of the electronic system 300. The system bus 320 is a single bus or any combination of busses according to various embodiments. The electronic system 300 includes a voltage source 330 that provides power to the integrated circuit 310. In some embodiments, the voltage source 330 supplies current to the integrated circuit 310 through the system bus 320.

The integrated circuit 310 is electrically coupled to the system bus 320 and includes any circuit, or combination of circuits according to an embodiment. In an embodiment, the integrated circuit 310 includes a processor 312 that can be of any type. As used herein, the processor 312 may mean any type of circuit such as, but not limited to, a microprocessor, a microcontroller, a graphics processor, a digital signal processor, or another processor. In an embodiment, the processor 312 includes, or is coupled with, package substrate 100, as disclosed herein. In an embodiment, SRAM embodiments are found in memory caches of the processor. Other types of circuits that can be included in the integrated circuit 310 are a custom circuit or an application-specific integrated circuit (ASIC), such as a communications circuit 314 for use in wireless devices such as cellular telephones, smart phones, pagers, portable computers, two-way radios, and similar electronic systems, or a communications circuit for servers. In an embodiment, the integrated circuit 310 includes on-die memory 316 such as static random-access memory (SRAM). In an embodiment, the integrated circuit 310 includes embedded on-die memory 316 such as embedded dynamic random-access memory (eDRAM).

In an embodiment, the integrated circuit 310 is complemented with a subsequent integrated circuit 311. Useful embodiments include a dual processor 313 and a dual communications circuit 315 and dual on-die memory 317 such as SRAM. In an embodiment, the dual integrated circuit 310 includes embedded on-die memory 317 such as eDRAM.

In an embodiment, the electronic system 300 also includes an external memory 340 that in turn may include one or more memory elements suitable to the particular application, such as a main memory 342 in the form of RAM, one or more hard drives 344, and/or one or more drives that handle removable media 346, such as diskettes, compact disks (CDs), digital variable disks (DVDs), flash memory drives, and other removable media known in the art. The external memory 340 may also be embedded memory 348 such as the first die in a die stack, according to an embodiment.

In an embodiment, the electronic system 300 also includes a display device 350, an audio output 360. In an embodiment, the electronic system 300 includes an input device such as a controller 370 that may be a keyboard, mouse, trackball, game controller, microphone, voice-recognition device, or any other input device that inputs information into the electronic system 300. In an embodiment, an input device 370 is a camera. In an embodiment, an input device 370 is a digital sound recorder. In an embodiment, an input device 370 is a camera and a digital sound recorder.

As shown herein, the integrated circuit 310 can be implemented in a number of different embodiments, including a package substrate having package substrate 100, according to any of the several disclosed embodiments and their equivalents, an electronic system, a computer system, one or more methods of fabricating an integrated circuit, and one or more methods of fabricating an electronic assembly that includes a package substrate having package substrate 100, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having package substrate 100 embodiments and their equivalents. A foundation substrate may be included, as represented by the dashed line of FIG. 3. Passive devices may also be included, as is also depicted in FIG. 3.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A package substrate includes a substrate core, a cavity below the substrate core that extends from a surface of a first resist layer to a bottom surface of the package substrate, and a first terminal and a second terminal in the first resist layer. One or more passive components are coupled inside the cavity to the first terminal and the second terminal.

Example Embodiment 2

The package substrate of example embodiment 1, wherein the one or more passive components is one or more capacitor and/or one or more inductor.

Example Embodiment 3

The package substrate of example embodiment 1, wherein the first terminal and the second terminal are solder terminals.

Example Embodiment 4

The package substrate of example embodiment 1, further including a plurality of residual pieces of release film on the sidewalls of the cavity.

Example Embodiment 5

The package substrate of example embodiment 1, further including a first buildup layer and a second buildup layer below a substrate core and a third buildup layer and a fourth buildup layer above the substrate core.

Example Embodiment 6

The package substrate of example embodiment 1, further including a first resist layer and a second resist layer below the substrate core and a third resist layer above the substrate core.

Example Embodiment 7

The package substrate of example embodiment 1, 2, 3, 4, 5 or 6 further including a plurality of through electrodes that extend through a substrate core.

Example Embodiment 8

A package substrate includes a substrate core, a first resist layer below the substrate core, a second resist layer below the substrate core, a first buildup layer below the substrate core, a second buildup layer below the substrate core, a first conductive terminal in the first resist layer, a second conductive terminal in the first resist layer, and a cavity that extends from a surface of the first resist layer to a bottom surface of the package substrate. One or more passive components are coupled inside the cavity to the first terminal and the second terminal.

Example Embodiment 9

The package substrate of example embodiment 8, wherein the one or more passive components is one or more capacitor and/or one or more inductor.

Example Embodiment 10

The package substrate of example embodiment 8, wherein the first terminal and the second terminal are solder terminals.

Example Embodiment 11

The package substrate of example embodiment 8, further including a plurality of residual pieces of release film on the sidewalls of the cavity.

Example Embodiment 12

The package substrate of example embodiment 8, further including a third buildup layer and a fourth buildup layer above the substrate core.

Example Embodiment 13

The package substrate of example embodiment 8, further including a third resist layer above the substrate core.

Example Embodiment 14

The package substrate of example embodiment 8, 9, 10, 11, 12 or 13 further including a plurality of through electrodes that extend through the substrate core.

Example Embodiment 15

A method includes forming a substrate core, forming a cavity below the substrate core that extends from a surface of a first resist layer to a bottom surface of the package substrate, and forming a first terminal and a second terminal in the first resist layer. One or more passive components are formed and the one or more passive components are coupled inside the cavity to the first terminal and the second terminal.

Example Embodiment 15

The example embodiment of claim 15, wherein the forming the one or more passive components includes forming one or more capacitor and/or one or more inductor.

Example Embodiment 17

The example embodiment of claim 15, wherein the forming the first terminal and the second terminal in the first resist layer includes forming solder in the first resist layer.

Example Embodiment 18

The method of example embodiment 15, further including forming a plurality of residual pieces of release film on the sidewalls of the cavity.

Example Embodiment 19

The method of example embodiment 15, further including forming a first buildup layer and a second buildup layer below a substrate core and a third buildup layer and a fourth buildup layer above the substrate core.

Example Embodiment 20

The method of example embodiment 15, 16, 17, 18 or 19 further including forming a first resist layer and a second resist layer below the substrate core and a third resist layer above the substrate core.

What is claimed is:

1. A package substrate, comprising:
   a substrate core;
   a cavity below the substrate core that extends from a surface of a first resist layer to a bottom surface of the package substrate;
   a first terminal and a second terminal in the first resist layer, the first terminal electrically coupled to a first through structure in the substrate core, and the second terminal electrically coupled to a second through structure in the substrate core;
   one or more passive components coupled inside the cavity to the first terminal and the second terminal; and
   a plurality of residual pieces of release film on sidewalls of the cavity, wherein one or more of the plurality of residual pieces of release film is laterally adjacent to a sidewall of one of the one or more passive components.

2. The package substrate of claim 1, wherein the one or more passive components is one or more capacitor and/or one or more inductor.

3. The package substrate of claim 1, wherein the first terminal and the second terminal are solder terminals.

4. The package substrate of claim 1, further including a first buildup layer and a second buildup layer below the substrate core and a third buildup layer and a fourth buildup layer above the substrate core.

5. The package substrate of claim 1, further including a first resist layer and a second resist layer below the substrate core and a third resist layer above the substrate core.

6. The package substrate of claim 1, further including a plurality of through electrodes that extend through the substrate core.

7. A package substrate, comprising:
   a substrate core;
   a first resist layer below the substrate core;
   a second resist layer below the substrate core;
   a first buildup layer below the substrate core; a second buildup layer below the substrate core;
   a first conductive terminal in the first resist layer, the first conductive terminal electrically coupled to a first through structure in the substrate core;
   a second conductive terminal in the first resist layer, the second conductive terminal electrically coupled to a second through structure in the substrate core;
   a cavity that extends from a surface of the first resist layer to a bottom surface of the package substrate;
   one or more passive components coupled inside the cavity to the first conductive terminal and the second conductive terminal; and
   a plurality of residual pieces of release film on sidewalls of the cavity, wherein one or more of the plurality of residual pieces of release film is laterally adjacent to a sidewall of one of the one or more passive components.

8. The package substrate of claim 7, wherein the one or more passive components is one or more capacitor and/or one or more inductor.

9. The package substrate of claim 7, wherein the first conductive terminal and the second conductive terminal are solder terminals.

10. The package substrate of claim 7, further including a third buildup layer and a fourth buildup layer above the substrate core.

11. The package substrate of claim 7, further including a third resist layer above the substrate core.

12. The package substrate of claim 7, further including a plurality of through electrodes that extend through the substrate core.

13. A method, comprising:
    forming a substrate core;
    forming a cavity below the substrate core that extends from a surface of a first resist layer to a bottom surface of a package substrate, wherein forming the cavity comprises forming a plurality of residual pieces of release film on sidewalls of the cavity;
    forming a first terminal and a second terminal in the first resist layer, the first terminal electrically coupled to a first through structure in the substrate core, and the second terminal electrically coupled to a second through structure in the substrate core; and
    forming one or more passive components and coupling the one or more passive components inside the cavity to the first terminal and the second terminal, wherein one or more of the plurality of residual pieces of release film is laterally adjacent to a sidewall of one of the one or more passive components.

14. The method of claim 13, wherein the forming the one or more passive components includes forming one or more capacitor and/or one or more inductor.

15. The method of claim 13, wherein the forming the first terminal and the second terminal in the first resist layer includes forming solder in the first resist layer.

16. The method of claim 13, further including forming a first buildup layer and a second buildup layer below the substrate core and a third buildup layer and a fourth buildup layer above the substrate core.

17. The method of claim 13, further including forming a first resist layer and a second resist layer below the substrate core and a third resist layer above the substrate core.

* * * * *